(12) United States Patent
Ohnhaeuser et al.

(10) Patent No.: US 7,196,643 B2
(45) Date of Patent: Mar. 27, 2007

(54) RESOLVER ARRANGEMENT

(75) Inventors: Frank Ohnhaeuser, Stein (DE); Michael Reinhold, Erlangen (DE); Mikael Badenius, Adelsdorf (DE)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/347,703

(22) Filed: Feb. 3, 2006

(65) Prior Publication Data
US 2006/0170579 A1 Aug. 3, 2006

(30) Foreign Application Priority Data
Feb. 3, 2005 (DE) .................. 10 2005 005 024

(51) Int. Cl.
*H03M 1/06* (2006.01)
(52) U.S. Cl. ...................................... 341/116; 341/143
(58) Field of Classification Search ................ 341/116, 341/143, 155
See application file for complete search history.

(56) References Cited

U.S. PATENT DOCUMENTS

| | | | | |
|---|---|---|---|---|
| 3,800,228 A | * | 3/1974 | Acker | ......................... 375/346 |
| 6,218,972 B1 | * | 4/2001 | Groshong | .................... 341/143 |
| 7,127,932 B2 | * | 10/2006 | Morell et al. | ................. 73/1.77 |
| 2002/0173931 A1 | | 11/2002 | Dudler et al. | |

FOREIGN PATENT DOCUMENTS

| | | |
|---|---|---|
| DE | 19841763 C1 | 9/1998 |
| DE | 10306127 A1 | 2/2003 |
| JP | 08149876 | 7/1996 |

* cited by examiner

*Primary Examiner*—Peguy JeanPierre
(74) *Attorney, Agent, or Firm*—W. James Brady, III; Frederick J. Telecky, Jr.

(57) ABSTRACT

A resolver arrangement that is inexpensive and yet offers high resolution and high noise rejection includes a carrier signal generator and two processing channels each of which has an analog input connected a different one of the stator coils and a channel output. Each of the processing channels includes a sigma-delta modulator with an output that supplies a bit-stream representative of an analog input signal received from a respective stator coil. Each channel also includes a first digital filter that receives the bit-stream from the sigma-delta modulator and converts the bit-stream to intermediate digital data-words. In addition, each channel has a digital synchronous demodulator that demodulates the intermediate digital data-words in synchronism with the carrier signal providing demodulated data-words. Finally, each channel has a second digital filter that averages the demodulated data-words and supplies digital output data-words on the channel output, the carrier signal being suppressed in the output data-words.

12 Claims, 3 Drawing Sheets

RESOLVER ARRANGEMENT

CROSS REFERENCE TO RELATED APPLICATIONS

This application claims priority under 35 U.S.C § 119 of German Application Ser. No. 102005005024.7, filed Feb. 3, 2005.

FIELD OF THE INVENTION

The present invention relates to a resolver arrangement for detecting the rotational position of a rotor with respect to a stator.

BACKGROUND OF THE INVENTION

Resolvers are typically used in motor controls. A resolver has three inductively coupled coils, one of which is carried by the rotor and the two other are arranged on the stator as mutually shifted by 90°. With each of the stator coils the rotor coil forms a transformer with a transmission coefficient that depends on the relative rotational position. A sinusoidal carrier signal is applied to the rotor coil, and so the stator coils provide amplitude modulated wave signals with a mutual phase shift of 90°, one of which is referred to as a sine wave and the other as a cosine wave signal. The angular position of the rotor is obtained by evaluating the sine and cosine wave signals.

For evaluation, the analog sine and cosine wave signals may be sampled with an analog-to-digital converter and processed digitally, applying an 'arctan' function. Available solutions are expensive, however.

SUMMARY OF THE INVENTION

The present invention provides a resolver arrangement that is inexpensive and yet offers high resolution and high noise rejection. Specifically, the resolver arrangement of the invention comprises a carrier signal generator and two processing channels each of which has an analog input connected a different one of the stator coils and a channel output, and each of the processing channels comprises a sigma-delta modulator with an output that supplies a bit-stream representative of an analog input signal received from a respective stator coil. Each channel also comprises a first digital filter that receives the bit-stream from the sigma-delta modulator and converts the bit-stream to intermediate digital data-words. In addition, each channel has a digital synchronous demodulator that demodulates the intermediate digital data-words in synchronism with the carrier signal providing demodulated data-words. Finally, each channel has a second digital filter that averages the demodulated data-words and supplies digital output data-words on the channel output, the carrier signal being suppressed in the output data-words. The sigma-delta modulator ensures a high noise rejection. The signal processing for evaluation of the sine and cosine signals, including demodulation, is moved to the digital domain. Inexpensive digital circuits can be used to perform the required processing.

In the preferred embodiment, a clock signal used in the sigma-delta modulator is applied to a clock input of the digital filter in the same processing channel, and each processing channel has an overall periodic notch filter characteristic. The frequency of the carrier signal is selected to fall into a notch of the filter characteristic. By using the inherent periodic notch characteristic and simply adjusting the frequency of the carrier signal to the frequency of a notch, a high carrier signal suppression rate is achieved without further selective filtering.

BRIEF DESCRIPTION OF THE DRAWINGS

Further advantages and features of the invention will become apparent from the following detailed description of a preferred embodiment with reference to the appending drawings. In the drawings.

DETAILED DESCRIPTION OF THE DRAWINGS

Figure 1:
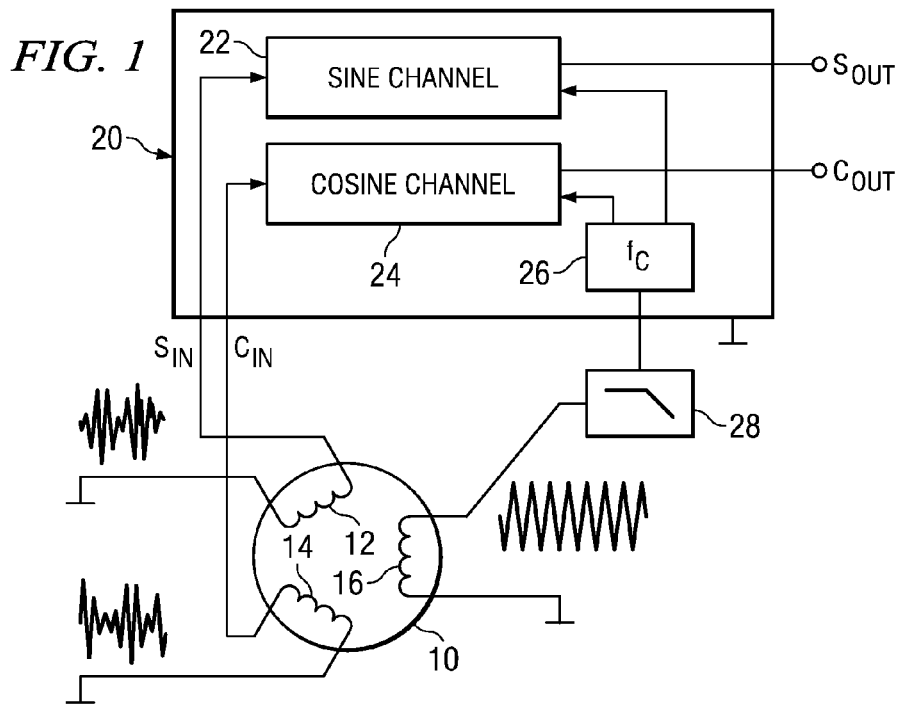
FIG. 1 is a schematic block diagram of a resolver arrangement.

With reference to FIG. 1, the resolver arrangement of the present invention is typically associated with a motor control for an electric motor. The electric motor 10 has a stator with a first stator coil 12 and a second stator coil 14, and a rotor with a rotor coil 16. The stator coils are mutually shifted by an angle of 90°. Each of the stator coils 12, 14 is inductively coupled with the rotor coil 16. A sinusoidal carrier signal of frequency $f_C$ is applied to the rotor coil. An amplitude modulated sine signal Sin is induced in the first stator coil 12, and an amplitude modulated cosine signal Cin is induced in the second stator coil 14.

A signal processing circuit 20 comprises a first signal processing channel, Sine Channel 22, a second signal processing channel, Cosine Channel 24 and a carrier signal generator 26 that generates a carrier signal of carrier frequency $f_C$. In a preferred embodiment, the carrier signal generator 26 provides a pulse-width modulated rectangular signal representative of a sine signal at the carrier frequency $f_C$. Carrier signal generator 26 has an output connected to rotor coil 16 through a low-pass filter 28. Sine channel 22 has an analog signal input connected to stator coil 12 to receive sine signal Sin, and Cosine channel 24 has an analog signal input connected to stator coil 14 to receive cosine signal Cin. Each of the sine and cosine channels 22, 24 also receive the carrier signal from signal generator 26. Sine channel 22 outputs a digital data word Sout representative of the demodulated sine input Sin from stator coil 12, and Cosine channel 24 outputs a digital data word Cout representative of the demodulated sine input Cin from stator coil 14.

Figure 2:
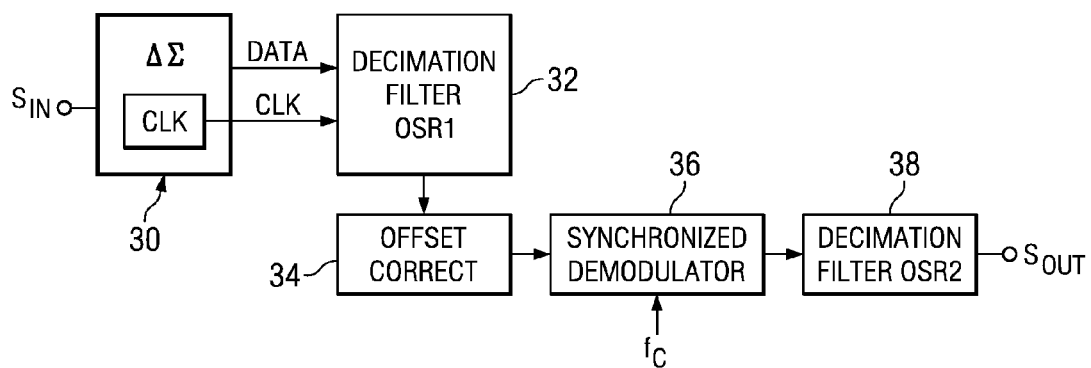
FIG. 2 is a schematic block diagram of a signal processing channel in FIG. 1.

FIG. 2 illustrates the configuration of the Sine channel 22 in FIG. 1, it being understood that the Cosine channel 24 would be identical in configuration.

A first stage in the sine channel 22 is a sigma-delta modulator 30 with an internal clock generator, an input to which the sine signal Sin is applied, a data output and a clock output. Alternatively, the sigma-delta modulator 30 may use an external clock signal. The data output of sigma-delta modulator is a digital single-bit stream which is applied to an input of a first digital filter 32 that operates at a first over-sampling rate OSR1. In the embodiment shown, filter 32 is a decimation filter and, more specifically, a digital $Sinc^n$ filter. A digital $Sinc^n$ filter has a transfer function equivalent to a function $$(x^{-1} * Sin\ x)^n$$

where n is equal to 1, 2, 3, . . . in the frequency domain. It is a periodic notch filter the notch frequencies of which are determined by the filter's over-sampling rate. The output of digital filter 32 consists of intermediate digital data-words at a medium data rate e.g. 78 to 300 kSPS (kilo samples per second), and a medium resolution, e.g., 12 to 14 bits.

Digital filter 32 is followed by an optional digital offset correction circuit 34 that detects a possible voltage offset and applies an appropriate corrective factor.

The thus offset corrected data-words are applied to an input of a digital synchronous demodulator 36 which also receives a synchronizing signal of the carrier frequency $f_C$. After demodulation, the digital-words are applied to an input of a further digital decimation filter 38 that operates at a second over-sampling rate OSR2, which is typically lower than the first over-sampling rate OSR1. The output Sout of digital filter 38 consists of digital data-words representative of the Sine signal, i.e. the envelope of the demodulated signal Sin. Due to the overall filter characteristic of the Sine channel 22, the carrier frequency $f_C$ is suppressed in the digital output Sout. As a matter of course, the Cosine channel 24 likewise has the carrier frequency $f_C$ suppressed in its digital output Cout.

Figure 3:
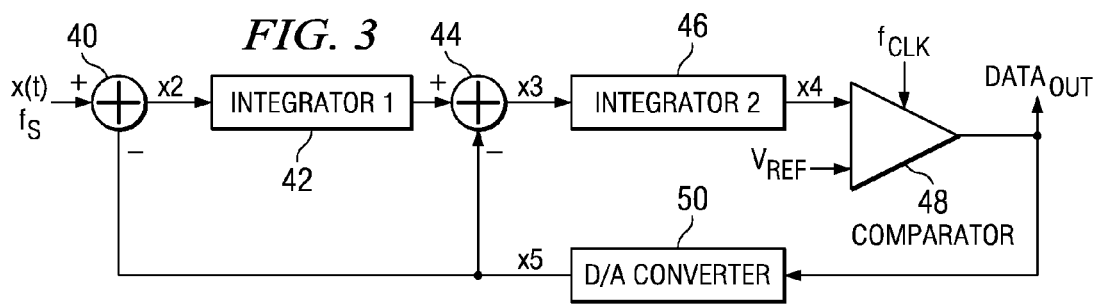
FIG. 3 is a schematic block diagram of a $2^{nd}$ order sigma-delta modulator in the block diagram of FIG. 2.
Figure 4:
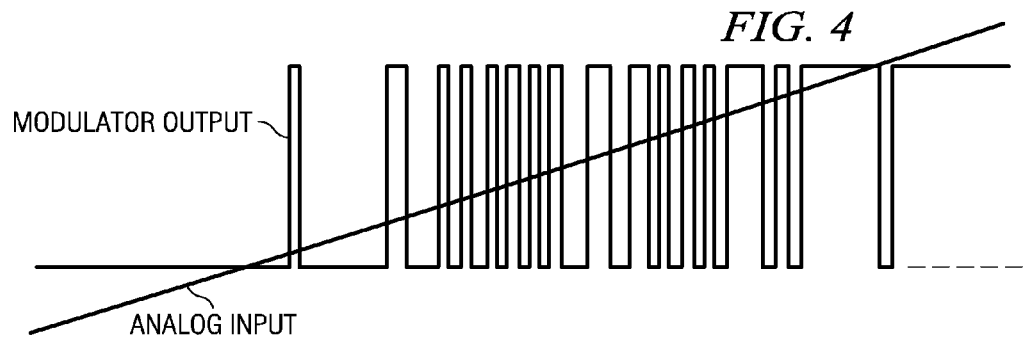
FIG. 4 is a diagram illustrating the function of a sigma-delta modulator.

With reference to FIG. 3, a sigma-delta modulator of second order consists of a first adder with a positive analog input x(t), a first integrator 42 connected to an output x2 of adder 40, a second adder 44 with a positive input connected to the output of integrator 42 and an output x3 connected to an input of a second integrator 46, a comparator 48 with a first input connected to output x4 of integrator 46, and a D/A converter 50 with an input connected to the output DATAout of comparator 48 and an output connected to negative inputs of adders 40 and 44. A second input of comparator 48 is connected to a reference voltage source, and a clock signal at clock frequency $f_{CLK}$ is applied to a clock input of comparator 48. Thus, the comparator 48 performs an A/D conversion. As is well known, the sigma-delta modulator converts an analog input signal such as x(t) to a digital single-bit data-stream, as illustrated in FIG. 4.

Figure 5:
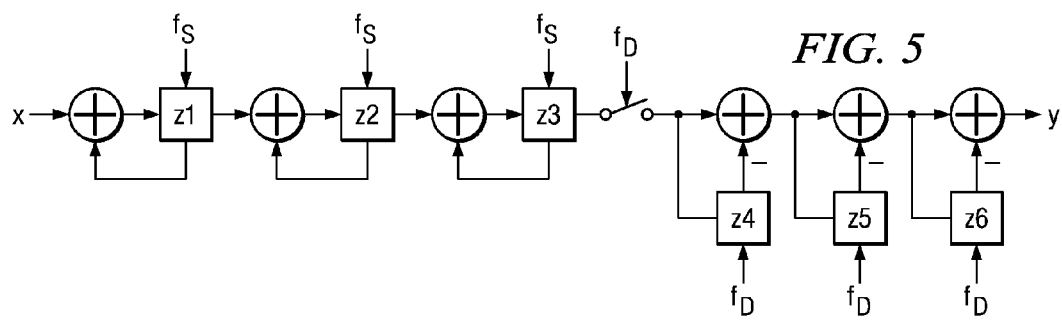
FIG. 5 is a schematic block diagram of a digital $Sinc^3$ filter.

The digital filter shown in FIG. 5 is a $3^{rd}$ order decimation filter with three cascaded accumulators z1, z2, z3 clocked at a frequency $F_S$ and three cascaded differentiators z4, z5, z6 clocked at a lower frequency $F_D$ and a switch in-between that is operated at frequency $F_D$. As is well known, such a filter converts a 1-bit data-stream x of high sample rate into a higher resolution multiple-bit data stream y at a lower sample rate.

Figure 6A:
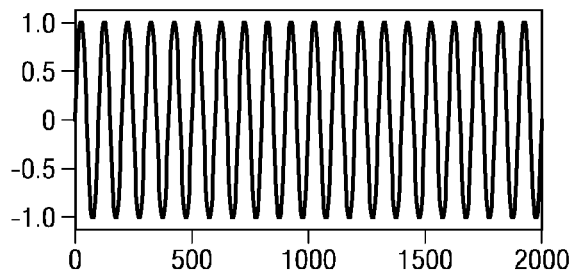
FIG. 6a is a diagram illustrating a sinusoidal carrier signal.
Figure 6B:
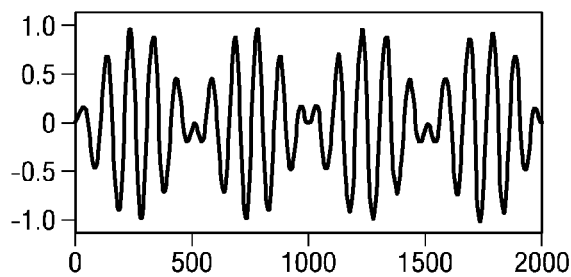
FIG. 6b is a diagram illustrating a modulated carrier signal corresponding to the Sine signal.
Figure 6C:
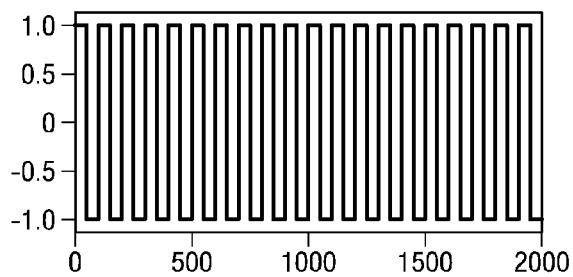
FIG. 6c is a diagram illustrating a rectangular wave signal at the frequency of a carrier signal.
Figure 6D:
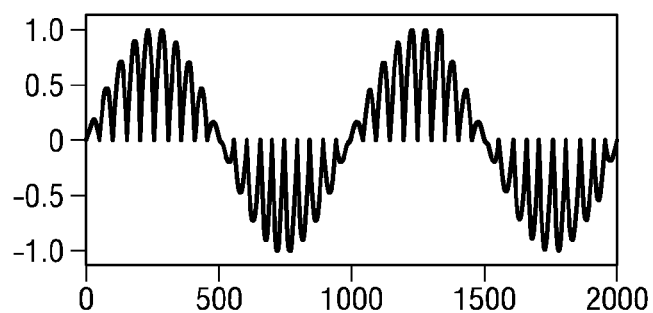
FIG. 6d is a diagram of a demodulated Sine signal.
Figure 7:
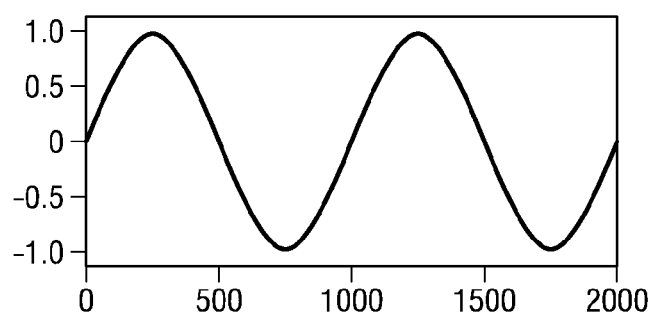
FIG. 7 is a diagram illustrating an envelope signal corresponding to the demodulated Sine signal in FIG. 6d.

In operation, a sinusoidal carrier signal such as illustrated in FIG. 6a is applied to rotor coil 16. In a specific embodiment, the carrier signal has a frequency of 10 kHz. Due to movement of the rotor, modulated signals such as shown in FIG. 6b are induced in stator coils 12, 14. In each of the Sine and Cosine channels, the modulated signal is converted to a 1-bit data stream by the sigma-delta modulator 30. The 1-bit data stream is filtered by digital filter 32 and thereby converted into a multi-bit data stream of lower sample rate and higher resolution. In a specific embodiment, the clock frequency of the sigma-delta modulator is 10.24 MHz and the over-sampling rate of digital filter 32 is 128. The multi-bit data stream is optionally corrected for any detected offset errors and then applied to synchronous demodulator 36. A synchronizing signal as shown in FIG. 6c is also applied to demodulator 36. FIG. 6d illustrates the resulting demodulated signal in the frequency domain. It should be clear, however, that demodulator 36 actually operates on digital samples, i.e. multi-bit data words, resulting after the sigma-delta modulation and subsequent decimation in digital filter 32. In an embodiment with a data rate of 10.24 MHz at the output of the sigma-delta modulator, the data rate is decimated to an intermediate data stream at a level of 80 kSPS and a resolution of 12 to 14 bit. In the second digital filter 38, the samples of the intermediate data stream are averaged to a further decimated data stream and higher resolution. In the specific embodiment, the over-sampling rate of digital filter 38 is 32, resulting in a data rate of 2.5 kSPS at a resolution of more than 14 bit. The resulting data stream is representative of an envelope signal such as shown in FIG. 7.

Figure 8:
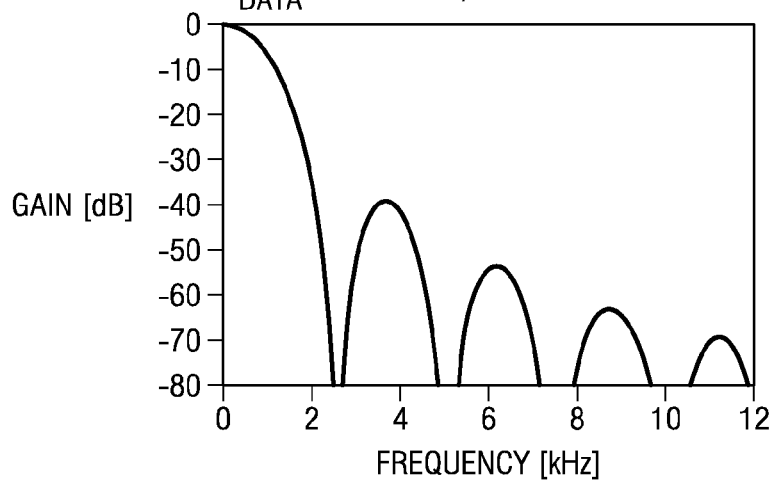
FIG. 8 is a diagram illustrating the overall filter characteristic of a signal processing channel as shown in FIG. 2.

With the parameters of the specific embodiment, the overall transfer function of each signal processing channel 22 or 24 has a periodic notch characteristic as apparent from FIG. 8. It is seen that the frequency of the carrier signal falls into a notch of the filter, so that the carrier frequency is effectively suppressed in the resulting data stream.

Although digital filter 32 has been disclosed as a Sinc filter of third order, it should be understood that other filter types would be appropriate as well. In an embodiment where a dual filter structure is integrated in a CMOS component, the filter structures are preferably configurable both with respect to the order of the filter function and the over-sampling rate. The over-sampling rate of the first digital filter 32 can range from 4 to 256, and that of the second digital filter 38 from 4 to 256. An example of a suitable filter function for filter 38 is that of an integrator. A suitable range for the clock signal $f_{CLK}$ is 10 to 16 MHz. With these parameters, the carrier frequency $f_C$ would be in a range from 10 to 20 kHz, which are typical values for a resolver application.

It should be clear that the resulting data streams of each of the Sine and Cosine channels are applied to digital signal processor for calculation of the rotational angle from the digital samples, applying an arctan function, as is well known.

The invention claimed is:

1. A resolver arrangement for detecting the rotational position of a rotor with respect to a stator, wherein the rotor carries a rotor coil and the stator has a pair of stator coils mutually shifted by 90°, and a carrier signal is applied to the rotor coil, the arrangement comprising a carrier signal generator and two processing channels each of which has an analog input connected a different one of the stator coils and a channel output; each of said processing channels comprising:

a sigma-delta modulator with an output that supplies a bit-stream representative of an analog input signal received from a respective stator coil;

a first digital filter that receives the bit-stream from the sigma-delta modulator and converts the bit-stream to intermediate digital data-words;

a digital synchronous demodulator that demodulates the intermediate digital data-words in synchronism with the carrier signal providing demodulated data-words; and a second digital filter that averages the demodulated data-words and supplies digital output data-words on said channel output, the carrier signal being suppressed in said output data-words.

2. The resolver arrangement according to claim 1, wherein a clock signal used in the sigma-delta modulator is applied to a clock input of the digital filter in the same processing channel.

3. The resolver arrangement according to any of claim 2, wherein the first digital filter operates at a first over-sampling rate, the second digital filter operates at a second over-sampling rate and the digital output data-words are provided at a data rate equal to the frequency of the clock signal divided by the product of the first and second over-sampling rates.

4. The resolver arrangement according to claim 3, wherein the first over-sampling rate is selected between 4 to 256, preferably at 128, the frequency of the clock signal is selected between 10 and 16 MHz and the second over-sampling rate is selected between 4 and 256, preferably at 32.

5. The resolver arrangement according to claim 1, wherein each processing channel has an overall periodic notch filter characteristic and the frequency of the carrier signal is selected to fall into a notch.

6. The resolver arrangement according to any of claim 1, wherein the digital filter is a $Sinc^n$ filter and the sigma-delta modulator is of (n-1) order.

7. The resolver arrangement according to claim 6, wherein n=3.

8. The resolver arrangement according to any of claim 1, wherein the carrier signal generator supplies a pulse width modulated signal representative of a sine signal and susceptible of being applied to the rotor coil through a low-pass filter.

9. The resolver arrangement according to any of claim 1, wherein each processing channel has means for detecting an offset in the respective analog input signal and correcting means for correcting the intermediate digital data-words to compensate for a detected offset.

10. The resolver arrangement according to any of claim 1, wherein the second digital filter is a digital integrator.

11. The resolver arrangement according to any of claim 1, wherein the first and second digital filters of both processing channels are all integrated in a CMOS component.

12. The resolver arrangement according to any of claim 1, wherein the digital filters are configurable both with respect to the order of the filter function and the over-sampling rate.

* * * * *